United States Patent
Hrouzek et al.

(10) Patent No.: US 12,165,833 B2
(45) Date of Patent: Dec. 10, 2024

(54) SYSTEM AND METHODS FOR AUTOMATED PROCESSING OF MULTIPLE SAMPLES IN A BIB SYSTEM

(71) Applicant: FEI Company, Hillsboro, OR (US)

(72) Inventors: Michal Hrouzek, Brno (CZ); Libor Novak, Brno (CZ); Krishna Kanth Neelisetty, Brno (CZ); Petr Wandrol, Brno (CZ)

(73) Assignee: FEI Company, Hillsboro, OR (US)

( * ) Notice: Subject to any disclaimer, the term of this patent is extended or adjusted under 35 U.S.C. 154(b) by 398 days.

(21) Appl. No.: 17/748,927

(22) Filed: May 19, 2022

(65) Prior Publication Data
US 2023/0377833 A1    Nov. 23, 2023

(51) Int. Cl.
*H01J 37/20* (2006.01)
*H01J 37/244* (2006.01)
(Continued)

(52) U.S. Cl.
CPC ............ *H01J 37/20* (2013.01); *H01J 37/244* (2013.01); *H01J 37/3023* (2013.01);
(Continued)

(58) Field of Classification Search
CPC ...... H01J 37/20; H01J 37/244; H01J 37/3023; H01J 37/304; H01J 37/3053; H01J 37/16; H01J 37/228; H01J 37/09; H01J 2237/0822; H01J 2237/204; H01J 2237/24585; H01J 2237/186; H01J 2237/201;
(Continued)

(56) References Cited

U.S. PATENT DOCUMENTS

2016/0024645 A1    1/2016  Hunt et al.
2018/0306685 A1*  10/2018  Boguslavsky ....... B28D 5/0023
(Continued)

FOREIGN PATENT DOCUMENTS

WO    2015070222 A1    5/2015
WO    2021171492 A1    9/2021

OTHER PUBLICATIONS

Application No. EP23173705.7, Extended European Search Report, Mailed On Nov. 3, 2023, 6 pages.

*Primary Examiner* — Kiet T Nguyen
(74) *Attorney, Agent, or Firm* — Kilpatrick Townsend & Stockton LLP

(57) ABSTRACT

Systems and methods for efficiently processing multiple samples with a BIB system, are disclosed. An example method for efficiently processing multiple samples with a BIB system according to the present invention comprises removing an individual sample holder containing a sample from a storage location within the BIB system, wherein the BIB system includes multiple sample holders positioned in one or more storage locations, loading the individual sample holder onto a sample stage configured to hold the sample holder during polishing of the corresponding sample held by the individual sample holder, and causing a BIB source to emit a broad ion beam towards the sample, wherein the broad ion beam removes at least a portion of the sample upon which it is incident. Once a desired portion of the sample is removed, the sample holder is removed from the sample stage and loaded back into the storage location.

20 Claims, 7 Drawing Sheets

(51) Int. Cl.
*H01J 37/302* (2006.01)
*H01J 37/304* (2006.01)
*H01J 37/305* (2006.01)

(52) U.S. Cl.
CPC ........ *H01J 37/304* (2013.01); *H01J 37/3053* (2013.01); *H01J 2237/0822* (2013.01); *H01J 2237/204* (2013.01); *H01J 2237/24585* (2013.01)

(58) Field of Classification Search
CPC ........ H01J 2237/3151; H01J 2237/061; B24B 1/002; B24B 13/00; G01N 1/32
USPC .................................................. 250/442.11
See application file for complete search history.

(56) References Cited

U.S. PATENT DOCUMENTS

2023/0375445 A1* 11/2023 Hrouzek .................. H01J 37/09
2023/0377834 A1* 11/2023 Hrouzek .................. G01N 1/32
2023/0420216 A1* 12/2023 Neelisetty ............... H01J 37/20

* cited by examiner

SYSTEM AND METHODS FOR AUTOMATED PROCESSING OF MULTIPLE SAMPLES IN A BIB SYSTEM

BACKGROUND OF THE INVENTION

Broad Ion Beam (BIB) polishing systems are used to prepare samples for investigation. Specifically, BIB polishing systems directing a high energy, unfocused or minimally focused beams of ions (e.g., Argon ions) at a sample, where the beam degrades and/or otherwise removes the portions of the sample upon which it is incident. Because the broad ion beam does not require focusing or requires minimal focusing, the BIB polishing systems do not have the optical column limitations of other sample preparation techniques (such as focused ion beam (FIB) milling), and thus BIB polishing systems can employ much higher primary energy beam currents. Due to the higher primary energy beam currents, BIB systems are able to more rapidly remove sample material to expose a region of interest that prior systems, enabling a faster sample preparation process.

Unfortunately, while highly efficient at removing sample material, samples being processed need to be precisely aligned with special masks that are designed to block portions of the beam from being incident on regions of the sample that users do not desire to be removed. Because this alignment process takes time and requires precise skill, it causes a slowdown in the sample preparation workflow. Additionally, because the higher current broad ion beam removes sample material more rapidly, the rate of redeposition of the removed material onto the broad ion beam source also increases forcing users to more frequently remove the source for cleaning requiring system downtime. Because of these limitations to workflow efficiency, the majority of the current use of BIB polishing systems has been to academic and other non-commercial applications. Therefore, it is desired to have new BIB polishing systems that are able to efficiently and accurately process many samples in shorter periods of time.

SUMMARY OF THE INVENTION

Systems and methods for efficiently processing multiple samples with a broad ion beam (BIB) system, are disclosed. An example method for efficiently processing multiple samples with a BIB system according to the present invention comprises removing an individual sample holder containing a sample from a storage location within the BIB system, wherein the BIB system includes multiple sample holders positioned in one or more storage locations, loading the individual sample holder onto a sample stage configured to hold the sample holder during polishing of the corresponding sample held by the individual sample holder, and causing a BIB source to emit a broad ion beam towards the sample, wherein the broad ion beam removes at least a portion of the sample upon which it is incident. Once a desired portion of the sample is removed, the sample holder is removed from the sample stage and loaded back into the storage location. This process can be repeated for multiple samples stored in the BIB system. In this way, if the samples are pre-aligned, the processing of multiple samples can be performed with little no user input or oversight.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

DETAILED DESCRIPTION OF EMBODIMENTS

Systems and methods for using broad ion beam (BIB) systems for more efficient processing of multiple samples are disclosed herein. More specifically, the disclosure includes BIB systems that are configured to receive and process one or more samples with an increased throughput and/or uptime over current BIB systems.

Figure 1:
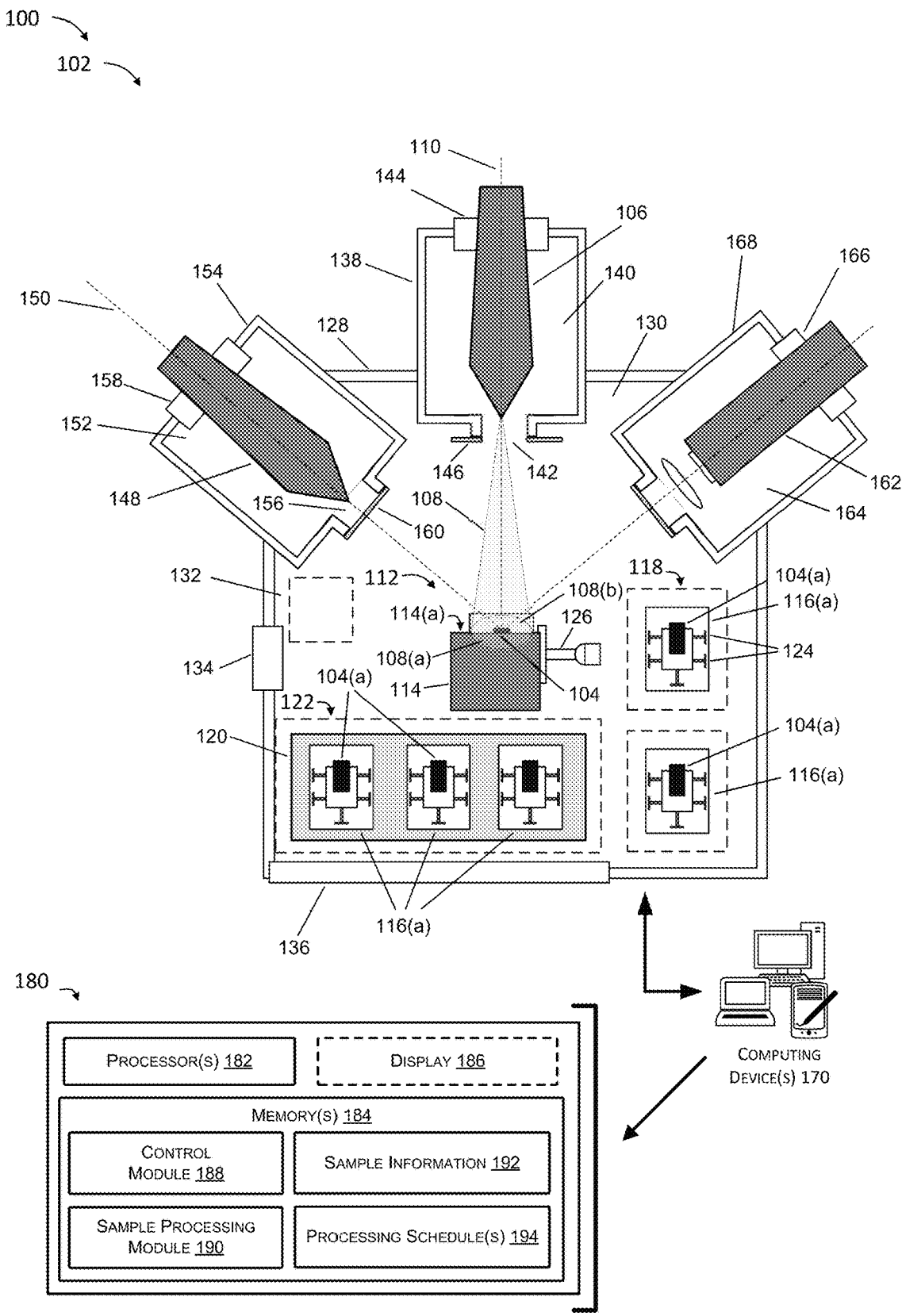
FIG. 1 depicts a cross section of example BIB systems according to the present disclosure that are configured to more efficiently process multiple samples.

FIG. 1 is an illustration of a cross section 100 example BIB system(s) 102 according to the present disclosure that are configured to more efficiently process multiple samples 104. The BIB systems 102 include a BIB source 106 that is configured to emit a broad ion beam 108 along a BIB axis 110 toward a sample stage area 112. The broad ion beam 108 is configured such that, when portions of the broad ion beam 108 are incident up on the sample 104, the material of the sample upon which the broad ion beam is incident are milled or otherwise removed from the sample. For example, in some embodiments the BIB source 106 may be an Ar ion source configured to emit a beam of Argon ions towards the sample stage 112.

The sample stage area 112 may include a mask 114 configured to block a portion of the broad ion beam 108 such that sample material corresponding to a portion of interest is not milled or otherwise removed from the sample 104 by incident ions. For example, FIG. 1 illustrates a first portion of the cross section of the broad ion beam 108(a) that is incident on the mask 114, and a second portion of the cross section of the broad ion beam 108(a) that is partially incident on a portion of the sample 104 whose material will be milled or otherwise removed by the broad ion beam 108. The mask 114 is composed of a hard material that is not degraded by the broad ion beam 108 allowing it to be used for the processing of multiple samples.

The sample stage area 112 may also include a holder interface configured to receive a sample holder 116 such that it can be positioned and held in relation to the mask 114 during processing of the sample 104 such that the mask protects portions of interest in the sample. In some embodiments, the sample stage area 112 may include a stage element that is capable of translating, tilting, or rotating the sample 104/sample holder 116. Additionally, in such embodiment the stage element may be further configured to translate, tile, or rotate the sample 104/sample holder 116 while the BIB source 106 emits the broad ion beam 108 toward the sample 104. For example, the stage element may be configured to periodically or continuously rotate the sample 104/sample holder 116 through a series of predefined angular positions, and/or rock the sample 104/sample holder 116 between two angular positions during milling with the broad ion beam. Such a translation/tilting/rotating can be done at a constant or varied speed. In this way, the stage element may dynamically change the portions of sample 104 irradiated by the broad ion beam 108 to allow for more efficient or otherwise optimized removal of sample material and/or polishing of a region of interest by the BIB system 102.

The sample holder 116 is configured to hold the sample 104 during processing as well as during transport of the sample 104 into the BIB system 102, out of the BIB system 102, and/or within the BIB system 102. FIG. 1 further shows the BIB system 102 as including one or more additional samples 104(a) held by corresponding additional sample holders 116(a). In some embodiments, the BIB system 102 has one or more optional sample storage volumes/areas 118 that sample holders can be parked within the BIB system 102 when the sample 104 that they hold is not currently being processed. FIG. 1 also shows the BIB system 102 as including a storage cassette 120 configured to hold a plurality of sample holders 116 that is positioned within a cassette storage volume 122. The storage cassette 120 is configured to allow many samples 104 and their corresponding sample holders 116 to be transported to and/or loaded into the BIB system 102.

In some embodiments, the sample holder 116 may include one or more optional adjustment elements 124 that allow the sample 104 to be translated, tilted, rotated, or otherwise repositioned in relation to the sample holder 116, the broad ion beam 108, and/or the mask 114. In embodiments with such adjustment elements 118, the BIB system 112 may comprise one or more interface elements that allow a user to manipulate the adjustment elements or the sample holder 116 itself so that the sample 104 has a desired geometric relationship with the mask 114 or a feature of the mask (e.g., the mask edge 114(a)). While FIG. 1 illustrates the adjustment elements 124 as being screws, a person having ordinary skill in the art would understand that there are many types of known adjustment elements that are able to translate, tilt, rotate, or otherwise reposition samples in relation to various types of sample holders. FIG. 1 also shows a sample holder manipulator 126 that is configured to reposition the sample holder 116 within the BIB system 102. For example, the sample holder manipulator 126 may be configured to move a sample holder between a sample holder storage volume 118 and the sample stage area 112. Moreover, in some embodiments, the sample holder manipulator 126 may be further configured to interface with the adjustment elements 124 to cause a translation, tilting, rotation, etc. of the sample 104.

The BIB system 102 also includes a housing 128 that defines an interior volume 130. In some embodiments, the interior volume may be a sealed volume that doesn't allow the passage of gas with the outside environment. In such embodiments, the interior volume may include a pump system 132 that is configured to adjust the pressure of the internal volume and/or change the gaseous makeup of the environment within the internal volume 130. For example, the pump system 132 may cause the interior volume 130 to be at a lower pressure than the outside the environment and/or be at vacuum. While FIG. 1 illustrates at least a portion of the pump system 132 as being optionally included within the interior volume, persons having skill in the art would understand that some or all of such a pump system 132 may be located outside of the interior volume 130. Alternatively, the pump system 132 may cause the gaseous makeup of the environment with in the internal volume 130 to be composed of inert gases (e.g., gases that do not interact with the broad ion beam 108 and/or sample 104 material during processing). The BIB system 102 is also shown as having a sample holder port 134 through which a sample holder 116 may be inserted into and/or removed from the BIB system 102. Moreover, FIG. 1 further illustrates the BIB system 102 as having an optional cassette port 136 configured to allow a storage cassette 120 to be inserted into and/or removed from the BIB system 102.

FIG. 1 further shows the BIB system 102 as including a source housing 138 that defines a source volume 140 that is configured to contain the BIB source 106. The source housing 138 also defines a BIB aperture 142 that connects the source volume 140 with the interior volume 130, and a BIB source maintenance aperture 144 (e.g., flange, door, or other type of sealable component that allows the source housing 138 to be switched between a sealed and unsealed state from the outside environment) which allows the BIB source 106 to be removed from or reinstalled within the source volume 140 (i.e., the source maintenance aperture 144 allows the BIB source 106 to be removed or accessed via the aperture 144 when unsealed). The BIB system 102 may further comprise a valve 146 configured to switch between an open state where the ions emitted from the BIB source 106 are allowed to pass through the BIB aperture 142 from the source volume 140 to interior volume 130, and a sealed state where the valve 146 prevents ions or emissions from the sample 104 from passing from the interior volume 130 to the source volume 130. A person having skill in the art would understand that valve 146 could correspond to any one of a shutter, a valve, a door, or other sealing mechanism that is able to toggle between an open and closed state.

FIG. 1 shows the valve 146 in an open state such that the broad ion beam 108 is allowed to pass into the interior volume so as to be incident on the sample 104 and mask 114. In some embodiments, when the valve 146 is in a closed state, the source volume 140 may be opened to the external environment (e.g., via the BIB source maintenance aperture 144) without affecting the pressure within the interior volume. In this way, when the valve 146 is in the closed state, the BIB source maintenance aperture 144 can be opened to allow the BIB source 106 to be cleaned, adjusted, removed, replaced, and/or otherwise maintained without affecting the pressure or gaseous composition of the interior volume 130. In such embodiments, the source volume 140 may further include an optional pump system that is able to re-establish the pressure and/or gas composition to match that of the interior volume 130. The BIB source maintenance aperture 144 may comprise a port that is configured to switch between an open state in which the first BIB source 106 can be removed from or reinstalled within the source volume 140, and a closed state in which the source volume 140 is sealed from the external environment.

Unlike a focused ion beam (FIB) system, the BIB system 102 does not comprise an optical column that includes optical elements configured to focus the ions emitted by the BIB source 106 so that it has a small spot size in and around the sample plane of the sample 104. Because such optical elements are only able to focus, correct, tune, and/or otherwise manipulate ion beams below certain strength thresholds, and since such optical elements are not required to focus the ions emitted by the BIB source 106, the strength of the broad ion beam (i.e. the primary beam current) used ion the BIB system 102 can be much greater than in FIB systems. This increase in beam current allows BIB systems 102 to remove sample material much faster than FIB systems. Applicant notes that persons having skill in the art will understand that some optical elements may be included to focus the broad ion beam in the BIB system 102, however the inclusion of such elements would impose lesser beam current limitations on the BIB system 102 than in FIB systems.

Due to the increased beam strength of the broad ion beam 108, material of the sample 104 upon which the broad ion beam 108 is incident is removed at a faster rate over FIB milling processes. Specifically, because the broad ion beam 108 has a higher beam strength and is incident on a large area of the sample, the rate that material is removed from the sample 104 is much higher than in FIB systems. Unfortunately, because of this increase in sample material removal, there is a proportional increase in material redeposition as the portions of the sample 104 that is removed by the broad ion beam 108 redeposits on surfaces within the interior volume 130 and/or the source volume 140. In current BIB systems this redeposition imposes a large efficiency reduction, as redeposition on the BIB source 106 forces users to frequently remove and/or otherwise access the BIB source 106 for cleaning and maintenance. Due to this cleaning and maintenance, current BIB systems have a high rate of downtime where they cannot be used for sample processing.

FIG. 1 shows the BIB system 102 as including an optional additional BIB source 148 that is configured to emit an additional broad ion beam along emission axis 150. The additional BIB source 148 is illustrate as being positioned within an additional source volume 152 defined by an additional source housing 154. The additional source housing 154 also defines an additional BIB aperture 156 that connects the additional source volume 148 with the interior volume 130, and an additional BIB source maintenance aperture 158 which allows the additional BIB source 148 to be removed from or reinstalled within the additional source volume 148.

The BIB system 102 may further comprise an additional valve 160 configured to switch between an open state where the ions emitted from the additional BIB source 148 are allowed to pass through the additional BIB aperture 156 from the additional source volume 152 to interior volume 130, and a sealed state where the additional valve 160 prevents ions or emissions from the sample 104 from passing from the interior volume 130 to the additional source volume 152. When the valve 160 is in a closed state, the additional source volume 152 may be opened to the external environment (e.g., via the additional BIB source maintenance aperture 158) without affecting the pressure within the interior volume 130. Thus, when the valve 160 is in the closed state, the BIB source maintenance aperture 158 can be removed to allow the additional BIB source 148 to be cleaned, adjusted, removed, replaced, and/or otherwise maintained without affecting the pressure or gaseous composition of the interior volume 130.

FIG. 1 shows the valve 160 in a closed state such sample material that is removed from the sample 104 via the broad ion beam 108 are not allowed to pass into the additional source volume 152 and/or redeposit on the additional BIB source 148. Because no redeposition occurs on the additional BIB source 148 while the BIB source 130 is in use, according to the present invention, the additional BIB source 148 will be able to be used to process the sample 104 (or additional samples) when the BIB source 140 needs to be removed and/or accessed for cleaning and/or maintenance. Thus, because the valve 146 can be closed to seal off the source volume 140 from the interior volume 130, the valve 160 can be opened so that the additional BIB source 148 can be used to emit an additional broad ion beam through the additional BIB aperture 156 to process samples. Therefore, in some embodiments of the present disclosure, the BIB system 102 is able to continuously process samples without downtime greatly increasing its efficiency. Additionally, while not shown in FIG. 1, in various embodiments the BIB system 102 may comprise only one BIB source or may comprise three or more BIB sources.

FIG. 1 also shows the BIB system 102 as optionally including a laser source 162 positioned within a laser volume 164 which may be configured to emit an optical beam through a laser aperture 166 defined by a laser housing 168. The optical beam emitted by the laser source 162 is of a higher beam energy and/or strength that the broad ion beam 108, allowing the optical beam to remove sample material upon which it is incident at a rate that is 10-50× greater that what is possible with a broad ion beam. For example, in less than 10 minutes an optical laser can remove as much Nickle or Cobalt as a broad ion beam can remove in 90 minutes. Moreover, for harder materials such as graphite, it takes present broad ion beams up to four hours to remove the same amount of material as an optical beam can remove in less than 10 minutes.

However, while the removal of the sample material is more rapid with an optical beam, milling and/or processing with the optical beam also causes damage/burning on the remaining sample surface. Therefore, in embodiments of the present invention, the BIB system 102 may use the optical beam to rapidly remove initial portions of the sample 104, the final portions of the sample 104 which need to be removed are removed using a broad ion beam from a BIB source (e.g., BIB source 106, additional BIB source 148, or another BIB source within the BIB system 102). In this way, the optical beam may be used to remove a bulk portion of the sample 104, followed by a broad ion beam being used to expose a region of interest and/or create a smoother or undamaged surface.

FIG. 1 further illustrates computing device(s) 170 associated with the BIB system 102. FIG. 1 illustrates computing device(s) 170 as being separate from the external devices 112, however in various embodiments one or more of these elements may be combined. That is, applicant notes that the computing device(s) 170 may be a component of the BIB system 102, may be a separate device from the BIB system 102 in communication via a network communication interface, or a combination thereof.

Those skilled in the art will appreciate that the computing devices 170 depicted in FIG. 1 are merely illustrative and are not intended to limit the scope of the present disclosure. The computing system and devices may include any combination of hardware or software that can perform the indicated functions, including computers, network devices, internet appliances, PDAs, wireless phones, controllers, etc. The computing devices 170 may also be connected to other devices that are not illustrated, or instead may operate as a stand-alone system. In addition, the functionality provided by the illustrated components may in some implementations be combined in fewer components or distributed in additional components. Similarly, in some implementations, the functionality of some of the illustrated components may not be provided and/or other additional functionality may be available.

FIG. 1 further includes a schematic diagram illustrating an example computing architecture 180 for the computing device(s) 170. Example computing architecture 180 illustrates additional details of hardware and software components that can be used to implement the techniques described in the present disclosure. In the example computing architecture 180, the computing hardware 170 of the BIB system 102 includes one or more processors 182 and memory 184 communicatively coupled to the one or more processors 182.

The example computing architecture 180 can include at least a control module 188, and a sample processing module 190 stored in the memory 184. The example computing architecture 180 is further illustrated as including sample information 192 and processing schedule(s) 194 stored on memory 184. The sample information 192 may correspond to data that describes characteristics of a sample, identification information for the sample, a history of the sample, a status of the sample, a positioning of the sample on a sample holder, a composition of the sample, a region of interest within the sample, and a surface of interest on in the sample, etc. The processing schedule(s) 194 may include one or more methods, settings, or instructions for processing the sample 104 with the BIB system 102 to achieve desired results (i.e., exposing an polishing a surface of interest within the sample 104 so that it may be examined using a charged particle microscope system). For example, a processing schedule 194 may include steps of one or more of the methods shown and described in association with FIGS. 3-6. A sample processing schedule 194 for a sample may include a laser strength, a laser milling time, a portion of the sample to be removed with the laser, a BIB strength, a BIB milling time, a portion of the sample to be removed with BIB, a surface of interest, an processing order, sample identification information, a region of sample to be removed, or a combination thereof. For example, a sample processing schedule 194 may be a data structure that identifies a plurality of steps that are to be carried out by components of the BIB system 102 in a particular order, where the data structure may also identify various parameters for the components and/or individual steps. In some embodiments, such processing schedules 194 may be at least partially presented to a user of the BIB system 102 to guide the processing of the sample, may be at least partially used by the computing device(s) 170 to automate and/or adjust settings associated with the processing of the sample, or a combination thereof.

In some embodiments, sample information 192 and/or individual processing schedule(s) 194 may be entered into the computing device 170 by a user (e.g., using a keypad, keyboard, mouse, voice command, touchscreen, etc.), received via a hardware connection (e.g., CD/DVD, USB, HDMI, portable memory, etc.), received over a network connection (e.g., Bluetooth, Wi-Fi, the Internet, etc.), received in association with the sample being inserted into the BIB system 102 (e.g., accessible memory on the sample holder 116), generated based on sensor information or sample information 192, or a combination thereof. For example, in an example embodiment the BIB system 102 may be configured to receive an identifier via an RFID on the sample holder 116, access sample information 192 associated with the identifier over a network connection, and then identify or generate a processing schedule 194 for the sample 104 based on the identifier, the sample information, or both.

As used herein, the term "module" is intended to represent example divisions of executable instructions for purposes of discussion and is not intended to represent any type of requirement or required method, manner, or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions.

The control module 188 can be executable by the processors 182 to cause a computing device 170 and/or BIB system 102 to take one or more actions and/or perform a step of a sample processing schedule. In some embodiments, the control module 188 may be executable to adjust the settings of individual components of the BIB system 102 (e.g., BIB source, laser source, etc.), cause individual components of the BIB system 102 to perform particular operations (e.g., move the sample holder within the BIB system 102, open or close valves, emit a broad ion beam, emit an optical beam, align the sample, adjust pressure settings or gases present in a volume 130, 140, and/or 152, etc.), or a combination thereof. For example, the control module 188 may be executable to cause the sample holder manipulator 126 to engage with a desired sample holder 116 stored within the BIB system 102 (e.g., stored in a storage cassette 120 positioned within a cassette storage volume 122, stored in a sample holder storage volume 118, etc.) and to translate, tilt, and/or rotate the engaged sample holder 116 to the sample stage area 112 so that it is nested with the mask 114 and the sample 104 has a desired geometric relationship with the mask 114. In such examples, the control module 118 may be further executable to return said sample holder 116 to the place it was stored within the BIB system 102 once the sample 104 has been processed, and then engage with an additional sample holder 116, and then translate the additional sample holder 116 to the sample stage area 112 so that the additional sample 104 can be processed.

Alternatively, or in addition, the control module 188 may cause a display 186 to present a processing protocol to a user, present information about the sample being processed, etc. For example, the control module 188 may present video/image information of the alignment of the sample with the mask 114, a surface of the sample 104 being removed/polished/processed, etc. In some embodiments, the control module 188 may cause the display 186 to present a graphical user interface that includes selectable interfaces that allow a user to input and/or alter data associated with the sample 104 and/or select protocol steps or component configurations that are to be used when processing the sample 104.

The sample processing module 190 can be executable by the processors 182 to at least partially automate the processing of samples 104 by the BIB system 102. For example, the sample processing module 190 may be executable to reposition sample holder(s) 116 in the BIB system 102, access sample information 192 for the sample, determine a processing schedule 194 for the sample 104, adjust the configuration of components of the BIB system 102 drive, and/or cause the components of the BIB system 102 to perform the processing of a sample 104. According to the present invention, the sample processing module 190 may obtain sample information 192 for a sample 104 that is to be processed. In various embodiments, the sample processing module 190 may obtain the information by receiving it from a user input, over a hardwire or wireless connection. Alternatively, or in addition, the sample processing module 190 may obtain the information by determining it based on sensor information.

The sample processing module 190 may also be executable to determine desired component configurations for the components of the BIB system 102 based on user input, sample information 192 for the sample 104, a processing schedule 194 associated with the sample 104, or a combination thereof. For example, based on sample information 192 indicating the composition of the sample material that is to be removed and the amount of material that is to be removed, the sample processing module 190 may determine a desired broad ion beam strength (e.g., BIB current, accelerating voltage, stage rocking, etc.) and time of irradiation with the broad ion beam required to process the sample 104, and may adjust the BIB source 106 configurations and/or the associated processing schedule 194 accordingly.

Additionally, sample processing module 190 may also be executable to obtain a processing schedule 194 associated with a sample 104 that is to be processed. Obtaining the processing schedule 194 may correspond to accessing a predetermined processing schedule from an accessible data structure, modifying a predetermined processing schedule, generating a processing schedule for the sample, or a combination thereof. For example, after determining an identifier of a sample (e.g., by scanning a barcode on the sample holder 116) the sample processing module 190 may use the identifier to access sample information 192 and/or a processing schedule 194 from a data structure stored on an accessible memory. Alternatively, or in addition, a user may enter an identifier for the sample, sample information 194, a desired result of the process, a type of processing to occur, etc., which the sample processing module 190 can use to generate a tailored processing schedule 194 that will cause the BIB system 102 to perform the desired processing of the sample. For example, based on the specifications of the processing schedule 194, the sample processing module 190 may cause the BIB system 102 to process one or more samples 104 using any of the methods shown in FIGS. 3-6. In some embodiments, the sample processing module 190 may provide a series of GUI's on the display 186 that allow a user to approve and/or give instructions to execute a step of the processing schedule 194. The sample processing module 190 may further be executable to perform some or all of the steps of the processing schedule 194 independent from user input.

The sample processing module 190 can be further executable by the processors 182 to automatically move sample holders 116 within the BIB system 102 so that many samples 104 can be processed in succession. For example, based on a user input identifying a plurality of samples that are to be processed, the sample processing module 190 may cause the sample holder manipulator 126 to sequentially move the associated sample holders 116 between storage locations (e.g., a storage cassette 120 positioned within a cassette storage volume 122, a sample holder storage volume 118, etc.) and the sample stage area 112 so that each of the identified samples can be processed. Because the sample processing module 190 is further configured to cause the BIB system 102 to perform some or all of the processing steps without user input, the sample processing module 190 allows the BIB system 102 to automatically process a plurality of samples is quick succession and without user oversight. In this way, the BIB systems 102 of the present disclosure allows a single user to monitor the sample processing of many samples across a plurality of BIB systems 102, and/or BIB systems 102 to be left without user oversight to process a series of samples over long periods of time.

The computing devices 170 include one or more processors configured to execute instructions, applications, or programs stored in a memory(s) accessible to the one or more processors. In some examples, the one or more processors may include hardware processors that include, without limitation, a hardware central processing unit (CPU), a graphics processing unit (GPU), and so on. While in many instances the techniques are described herein as being performed by the one or more processors, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories accessible to the one or more processors are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory and other storage devices for purposes of memory management and data integrity. Alternatively, in other implementations, some or all of the software components may execute in memory on another device and communicate with the computing devices 170. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing devices 170 may be transmitted to the computing hardware and the computing devices 170 via transmission media or signals such as electrical, electromagnetic, or digital signals, conveyed via a communication medium such as a wireless link. Various implementations may further include receiving, sending, or storing instructions and/or data implemented in accordance with the foregoing description upon a computer-accessible medium.

Figure 2:
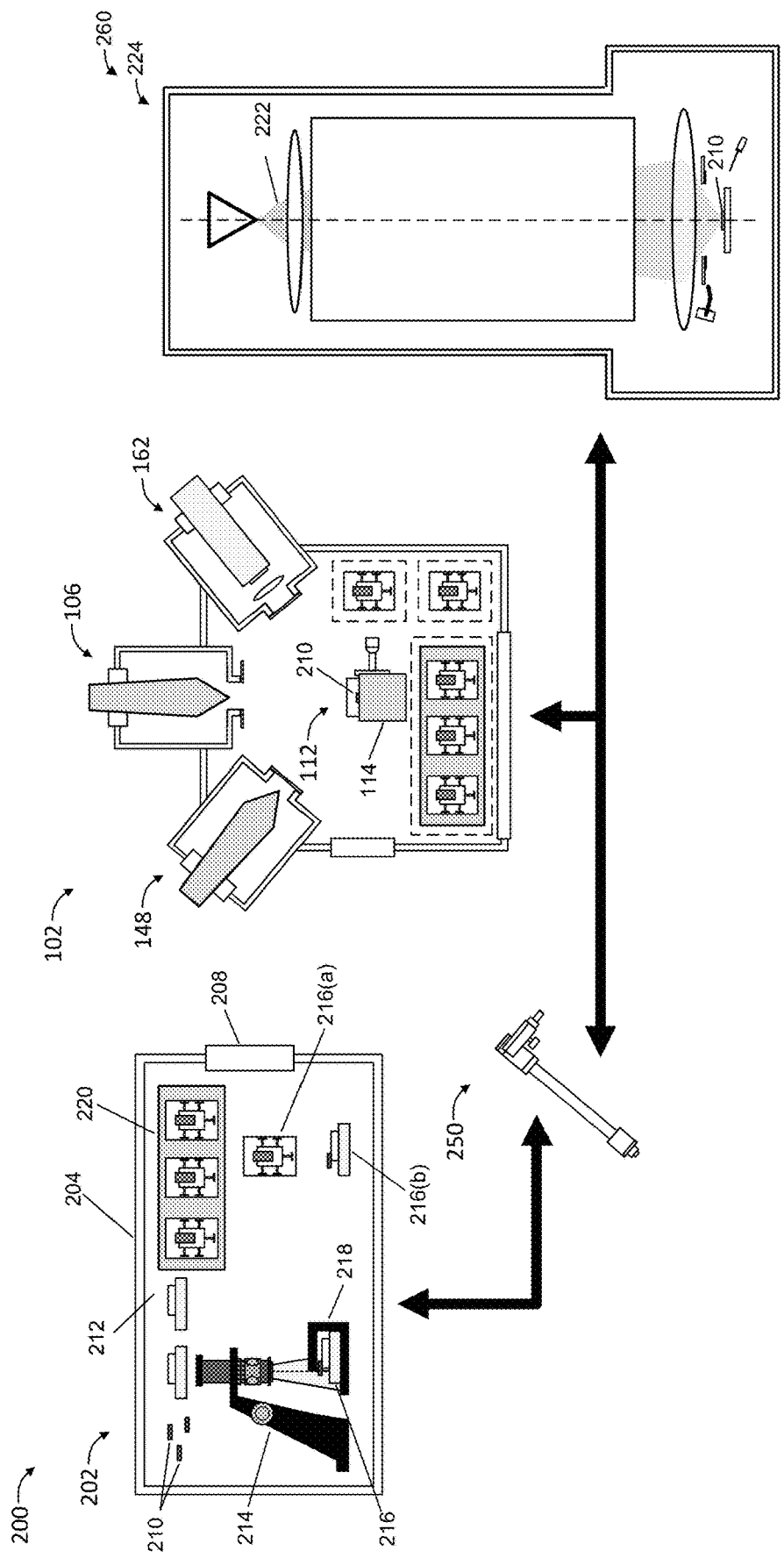
FIG. 2 illustrates of an example environment for more efficient processing of multiple samples within a sample preparation workflow.

FIG. 2 is an illustration of an example environment 200 where BIB system(s) 102 for more efficient processing of multiple samples within a sample preparation workflow. Specifically, FIG. 2 illustrates the environment 200 as including a sample preparation station 202, a sample transportation device 250, a BIB system 102, and a charged particle microscope 260. However, persons having skill in the art will understand how different stations, components, and devices may be used to allow the BIB systems 102 according to the present disclosure to efficiently process samples. For example, the example environment 200, or component elements/stations/devices therein, may be used to practice the methods described in FIGS. 3-6 as well as other processes described herein.

FIG. 2 illustrates the sample preparation station 202 as being a hooded work area having a controlled pressure and atmospheric gas composition. Specifically, FIG. 2 shows the sample preparation station 202 comprising a barrier material 204 that defines a working volume 206 and one or more optionally sealable apertures 208 through which components can be passed between the working volume 206 and the outside environment. However, a persona having skill in the art would understand that the sample preparation station 202 may correspond to an open environment. Additionally, while the sample preparation station 202 is illustrated in FIG. 2 as being separate from the BIB system 102, a person having skill in the art would understand that in some embodiments the sample preparation station 202 may be included within the BIB system 102 in a separate chamber form the interior volume such that a sample may be aligned on a sample holder in the sample preparation station 202 while a different sample is processed by a BIB source within the interior volume of the BIB system 102.

In some embodiments, a user can select the pressure and atmospheric gas composition within the working volume 206 so that they are optimal for preparation of a desired sample 210 type. The working volume 206 is depicted as containing example elements for preparing samples 210 for processing in BIB systems 102. For example, the working volume 206 is shown as including a plurality of samples 210 that have been harvested/generated and prepared for examination, a plurality of empty sample holders 212 upon which the samples 210 can be positioned, an example aid 214 for aligning/positioning the sample on a sample holder, and sample holders 216 that contain a sample. While the example aid 214 is illustrated as being an optical microscope system, a person having skill in the art will understand that different types of samples 210/preparation workflows may require different types of aids to optimally align/position samples on the sample holder.

In some embodiments of the present invention, the preparation station further includes an additional mask 218 for aligning the sample 210 on the sample holders 212. The additional mask 218 is geometrically configured such that when a sample is aligned and/or positioned to have a certain geometric relationship between the sample and an edge of the additional mask 218 when the sample holder is nested with the additional mask 218, then the sample 210 will have the same certain geometric relationship between the sample and the edge of the mask 114(*a*) when the sample holder is nested with the mask 114 within the BIB system 102. This geometric similarity between the mask 114 and the additional mask 218 allows for samples to be aligned on their respective sample holders without taking up potential time in which the BIB system 102 can be processing samples with broad ion and/or optical beams. In some embodiments, aligning the sample within the sample preparation station 202 may correspond to an optically aligning the sample without the use of the additional mask 218. For example, a sample may be optically aligned with respect to the sample holder by adjusting an adjustable portion of the sample holder such that the sample will be in a desired position with the sample holder is nested with the mask 114 within the BIB system 102. Example methods for optically aligning the sample in this way include, but are not limited to adjusting a sample edge to a marked position (e.g., using an optical microscope and/or an image recognition algorithm), using a laser gate sensing to determine desired positioned, etc.

Additionally, FIG. 2 shows the sample preparation system as including a storage cassette 220 that is configured to hold a plurality of sample holders 216. The storage cassette 220 is configured to allow many samples 204 and their corresponding sample holders 216 to be transported to and/or loaded into the BIB system 102. In this way, a user can use the additional mast 218 to pre-align each multiple samples 210 and then load them within a storage cassette 220.

FIG. 2 further shows an optional sample transportation device 204 that is configured to transport the sample holder 216 between the sample preparation station 202 and the BIB system 102 and/or between the BIB system 102 and the charged particle microscope 206. In some embodiments, the sample transportation device 204 may maintain a desired pressure and/or gas environment around the sample holder 216 during transportation. In such embodiments, the sample transportation device 204 allow a sample to be prepared in the sample preparation station 202, processed in the BIB system 102, and investigated in the charged particle microscope 206 without being exposed to a pressure or gas other than the desired pressure and/or gas environment. Alternatively, the sample holder 216 or the storage cassette 220 may be themselves transported between the sample preparation station 202 and the BIB system 102. In some embodiments, the storage cassette 220 may be able to maintain the plurality of sample holders 216 it contains at a desired pressure and/or gas environment.

FIG. 2 further shows the example environment 200 as including example BIB system(s) 102 as described in association with FIG. 1. The BIB systems 102 include a BIB source 106 and an optional additional BIB source 148 that are configured to emit a broad ion beam along a BIB axis toward a sample stage area 112. The broad ion beam is configured such that, when portions of the broad ion beam incident up on the sample 210, the material of the sample upon which the broad ion beam is incident are milled or otherwise removed from the sample. The sample stage area 112 may include a mask 114 configured to block a portion of the broad ion beam such that sample material corresponding to a portion of interest is not milled or otherwise removed from the sample 210 by incident ions. The sample stage area 112 may also include a holder interface configured to receive a sample holder 216 such that it can be positioned and held in relation to the mask 114 during processing of the sample 210 such that the mask protects portions of interest in the sample. BIB system 102 is further shown as including an optional laser source 162. The BIB systems 102 are configured to process samples as described in the discussion of FIG. 1 and/or according to the methods described in FIGS. 3-6 as well as other processes described herein.

Example environment 200 is further depicted as including charged particle microscope system(s) 206 for inspection of a sample 210 that has been processed with a BIB system 102 according to the present invention. The example charged particle microscope system(s) 206 may include electron microscope (EM) setups or electron lithography setups that are configured to irradiate and/or otherwise impinge the sample 210 with a beam of electrically charged particles 222 (usually an electron beam or an ion beam). In various embodiments the charged particle microscope system 206 may be or include one or more different types of EM and/or charged particle microscopes, such as, but not limited to, a scanning electron microscope (SEM), a scanning transmission electron microscope (STEM), a transmission electron microscope (TEM), a charged particle microscope (CPM), dual beam microscopy system, etc. Additionally, in some embodiments a TEM is capable of operating as a STEM as well. FIG. 2 shows the example charged particle microscope system(s) 206 as being a scanning electron microscope (SEM) 224.

Figure 3:
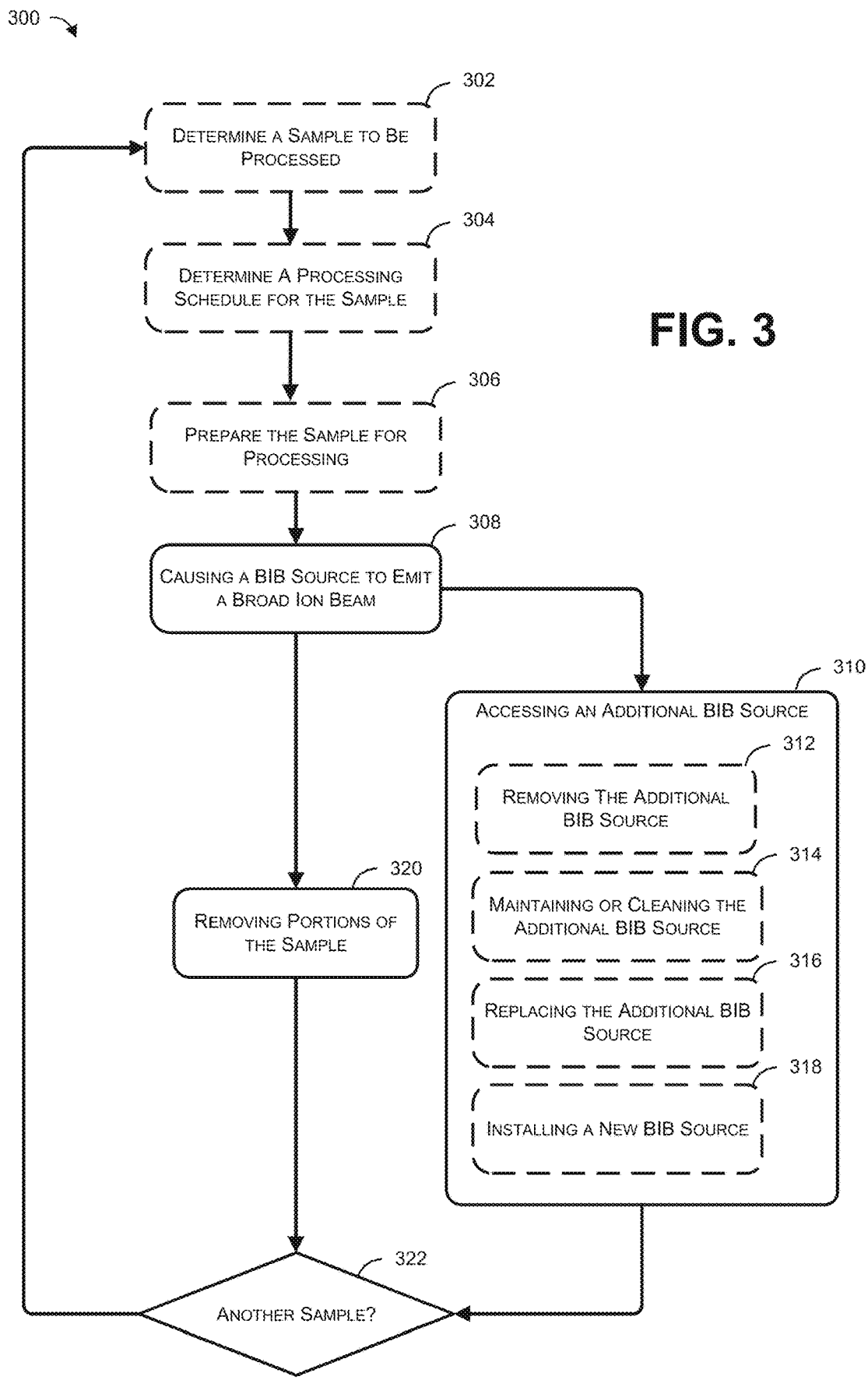
FIG. 3 depicts an example process for processing samples with a dual BIB system enabling increased system uptime, according to the present invention.

FIG. 3 depicts a sample process 300 for processing samples with a dual BIB system enabling increased system uptime, according to the present invention. The process 300 may be implemented with any of the BIB systems 102, in any environment, including any of the example environment(s) 200 for more efficient processing of multiple samples within a sample preparation workflow.

At step 302, a sample to be processed is optionally determined. For example, the sample to be processed may be determined based on an input received from a user via an interface on the BIB system, or via an associated computing device. Alternatively, the sample to be processed may be determined by the BIB system or an associated computing device accessing a data structure (i.e., table, schedule, metadata, etc.) and/or execute instructions that result in the determination of the next sample to be processed. For example, a BIB system may be configured such that it sequentially accesses a plurality of sample holders that are stored within it, allowing a user to preload a number of samples into the BIB system to be automatically processed in series. In such an example, the BIB system of associated computing device would keep track of the order the samples are to be processed which sample of the plurality is next to be processed.

At step 304, a processing schedule for the sample is determined. A processing schedule for the sample corresponds to the BIB system configurations and workflow settings that are to be followed to achieve a desired processing result for the sample (e.g., a BIB strength, a BIB milling time, a portion of the sample to be removed with BIB, a surface of interest, or a combination thereof). In some embodiments, the processing schedule may be input by a user by selecting a processing schedule from a list of premade processing schedules, inputting/generating a new processing schedule, inputting individual step or configuration instructions, or a combination thereof. For example, an associated computer may present a graphical user interface that includes selectable interfaces that allow a user to input and/or alter data associated with the sample and/or select protocol steps or component configurations that are to be used when processing the sample. In another example, in cases where a BIB system is frequently used to process a particular type of sample to prepare it for a certain examination modality, the BIB system or associated computer may have stored an associated processing schedule that a user can select (either manually or via metadata associated with the sample, sample holder, etc.) to initiate the frequently used processing configuration/workflow.

In some embodiments, the processing schedule may be received with sample information associated with the sample to be processed. Sample information includes one or more of a sample identification information, sample composition, a region of interest, a surface of interest, associated processing schedules, etc. Alternatively, or in addition, the BIB system or associated computing system may use predefined rules/instructions to determine the processing schedule for the sample based on the sample information. For example, a user may enter an identifier for the sample which the BIB system may use to access a data structure that specifies the relevant sample information, which the BIB system then uses predefined rules to create a tailored processing schedule that will cause the BIB system to perform the desired processing of the sample. As an example, the BIB system may set the beam strength of the broad ion beam based on the material composition that is to be removed, and/or adjust the milling time based on the amount of the material that is to be removed.

At step 306, the sample is prepared for processing. Preparing the sample for processing may include harvesting the sample from a larger specimen or otherwise generating the sample (e.g., growing or depositing portions of the sample), loading the sample onto a sample holder, aligning the sample, transporting the sample to the BIB system, transporting the sample holder to a sample stage area within the BIB system, etc. For example, the BIB system may cause a component sample holder transporting element to retrieve a sample holder associated with the sample to be processed from a storage area, and translate, tilt, and/or rotate the sample holder so that the geometric relationship between the sample and a protective mask is such that the mask will protect desired portions of the sample during irradiation/milling.

At step 308, a BIB source is caused to emit a broad ion beam toward the sample. FIG. 3 further shows step 310 as being performable while the broad ion beam is being emitted toward the sample. At step 310 an additional BIB source is accessed. According to the present invention, the additional BIB source is positioned within a volume that can be selectable sealed from the interior of the BIB system via a valve. In this way, when the valve is closed, milled material from the sample cannot pass into the volume containing the additional BIB source. Additionally, in some embodiments the pressure and/or gaseous makeup is not affected when the additional BIB source is accessed. In various embodiments, accessing the additional BIB source at 310 may include one or more of removing the additional BIB source 312 from the BIB system (e.g., for cleaning, adjustment, repair, etc.), performing maintenance on the additional BIB system 314 (e.g., cleaning, aligning, etc.), replacing the additional BIB source 316 (e.g., reinstalling the BIB source after cleaning/maintenance), and/or installing a new BIB source 318 in the BIB system.

At step 320, portions of the sample are removed with the broad ion beam. According to the present invention, step 320 may include milling with a source different from the broad ion beam, such as the dual optical and ion milling process described in FIG. 4. In step 320 portions of the sample that are not shielded by the protective mask are removed from the sample. In this way, a region of interest and/or portion of the sample that will be subject to additional processing may be rapidly exposed.

At step 322, it is determined whether another sample is to be milled. If the answer at 322 is yes, then the process returns to step 302 and the sample that is to be processed is determined. In this way, numerous samples can be processed while the additional BIB system is being accessed. If the answer at 322 is no, then the process 300 may end.

Figure 4:
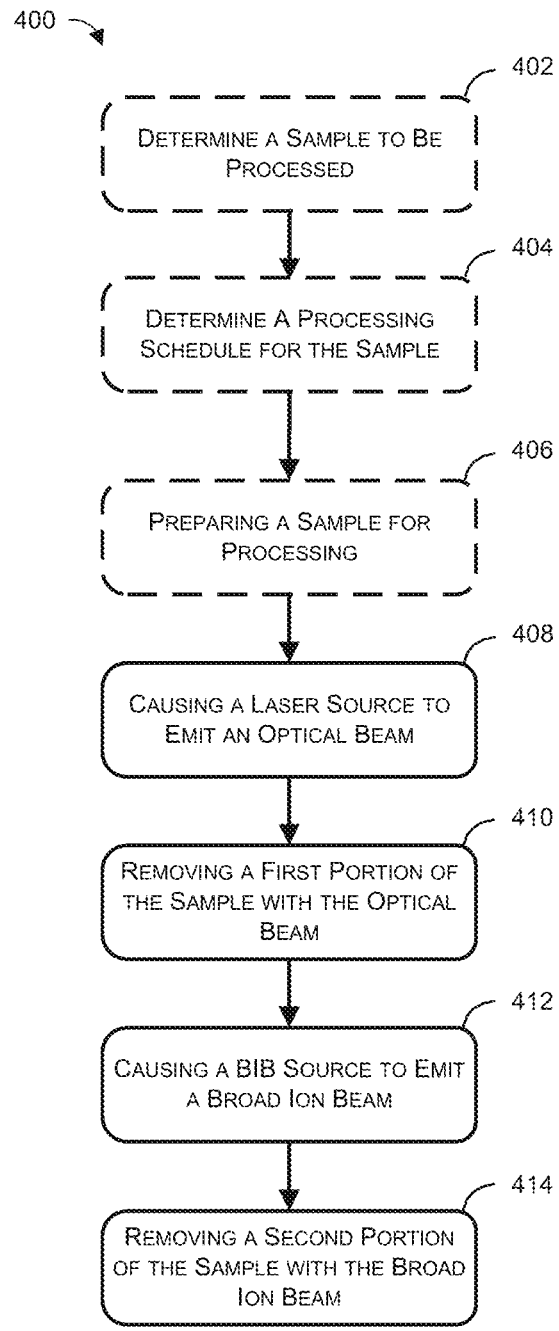
FIG. 4 depicts an example process for processing samples with a dual mode, optical and BIB milling system for more efficient sample processing, according to the present invention.

FIG. 4 depicts a sample process 400 for processing samples with a dual mode, optical and BIB milling system for more efficient sample processing, according to the present invention. The process 400 may be implemented with any of the BIB systems 102, in any environment, including any of the example environment(s) 200 for more efficient processing of multiple samples within a sample preparation workflow.

At step 402, a sample to be processed is optionally determined. For example, the sample to be processed may be determined based on an input received from a user via an interface on the BIB system, or via an associated computing device. Alternatively, the sample to be processed may be determined by the BIB system or an associated computing device accessing a data structure (i.e., table, schedule, metadata, etc.) and/or execute instructions that result in the determination of the next sample to be processed.

At step 404, a processing schedule for the sample is determined. A processing schedule for the sample corresponds to the BIB system configurations and workflow settings that are to be followed to achieve a desired processing result for the sample (e.g., a BIB strength, a BIB milling time, a portion of the sample to be removed with BIB, a surface of interest, or a combination thereof). In various embodiments, the processing schedule may be input by a user, received with sample information associated with the sample to be processed, or determined by the BIB system (e.g., based on the sample information).

At step 406, the sample is prepared for processing. Preparing the sample for processing may include harvesting the sample from a larger specimen or otherwise generating the sample (e.g., growing or depositing portions of the sample), loading the sample onto a sample holder, aligning the sample, transporting the sample to the BIB system, transporting the sample holder to a sample stage area within the BIB system, etc. For example, the BIB system may cause a component sample holder transporting element to retrieve a sample holder associated with the sample to be processed from a storage area, and translate, tilt, and/or rotate the sample holder so that the geometric relationship between the sample and a protective mask is such that the mask will protect desired portions of the sample during irradiation/milling.

At step 408, a laser source is caused to emit an optical beam (e.g., laser) toward the sample. The optical beam emitted by the laser source is of a higher beam energy and/or strength than a broad ion beam. At step 410, a first portion of the sample are removed with the optical beam. Because of the increased strength of the optical beam, it can remove sample material upon which it is incident at a rate that is 10-50× greater that what is possible with a broad ion beam. However, while the removal of the sample material is more rapid with an optical beam, milling and/or processing with the optical beam also causes damage/burning on the remaining sample surface.

At step 412, a BIB source is caused to emit a broad ion beam toward the sample, and at step 414, a second portion of the sample are removed with the broad ion beam. Because the broad ion beam is able to remove sample material without damaging the sample surface, the broad ion beam is able to remove final portions of the sample (i.e., damaged portions of the sample) without causing further damage to the sample. In this way, once a large portion of material is rapidly removed with the optical beam, the broad ion beam can be used to remove final portions of the sample to expose a region of interest.

Figure 5:
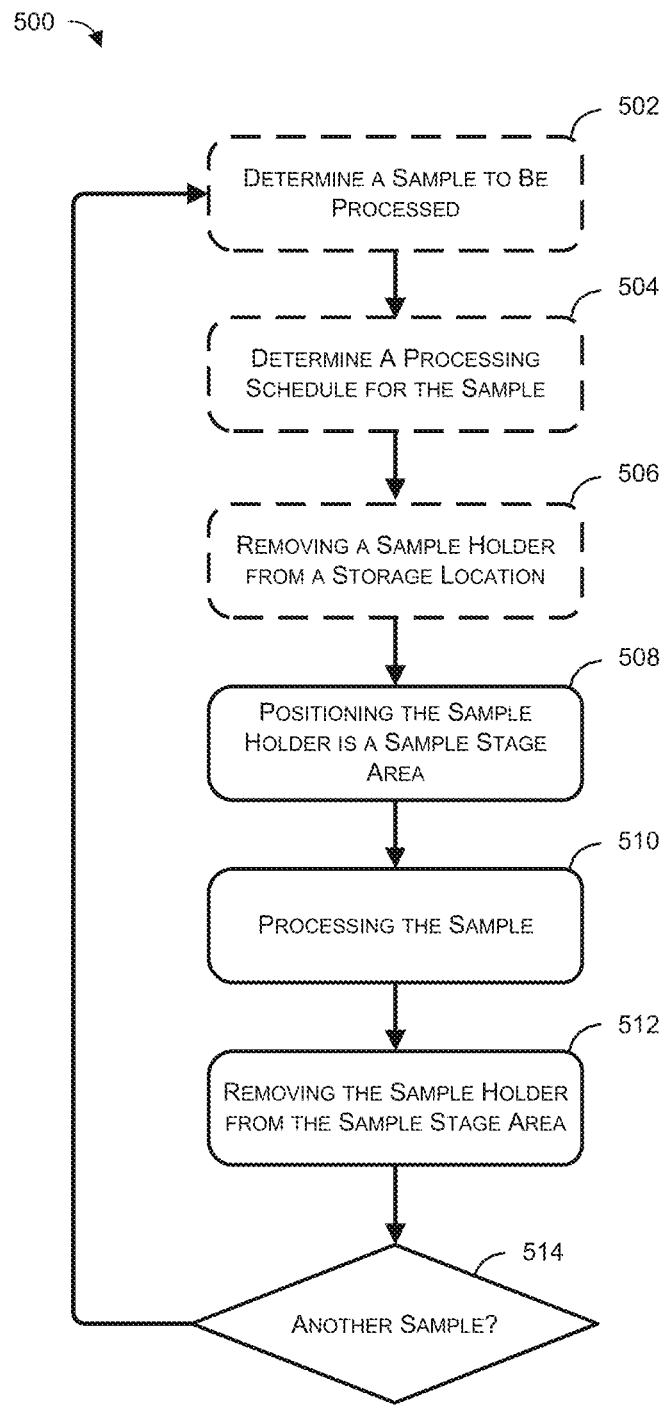
FIG. 5 depicts an example process for a processing multiple samples within a dual BIB system with reduced downtime, according to the present invention.

FIG. 5 depicts a sample process 500 for a processing multiple samples within a dual BIB system with reduced downtime, according to the present invention. The process 500 may be implemented with any of the BIB systems 102, in any environment, including any of the example environment(s) 200 for more efficient processing of multiple samples within a sample preparation workflow.

At step 502, a sample to be processed is optionally determined. For example, the sample to be processed may be determined based on an input received from a user via an interface on the BIB system, or via an associated computing device. Alternatively, the sample to be processed may be determined by the BIB system or an associated computing device accessing a data structure (i.e., table, schedule, metadata, etc.) and/or execute instructions that result in the determination of the next sample to be processed.

At step 504, a processing schedule for the sample is determined. A processing schedule for the sample corresponds to the BIB system configurations and workflow settings that are to be followed to achieve a desired processing result for the sample (e.g., a BIB strength, a BIB milling time, a portion of the sample to be removed with BIB, a surface of interest, or a combination thereof). In various embodiments, the processing schedule may be input by a user, received with sample information associated with the sample to be processed, or determined by the BIB system (e.g., based on the sample information).

At step 506, a sample holder associated with the sample to be processed is removed from a storage location within the BIB system. For example, the BIB system may cause a component sample holder transporting element (e.g., sample holder manipulator) to retrieve a sample holder associated with the sample to be processed from a storage area within the BIB system and/or from within a sample storage/transport device (e.g., a storage cassette).

At step 508, the sample holder is positioned in a sample stage area. Specifically, the sample holder may be translated, tilted, and/or rotated by a sample holder transporting element such that a geometric relationship between the sample and a protective mask is such that the mask will protect desired portions of the sample during irradiation/milling. In some embodiments, the sample may also be aligned with the mask based on user and/or sensor input. Alternatively, or in addition, the sample may have been realigned using a workflow such as the one described in FIG. 6.

At step 510, the sample is processed. Specifically, a BIB source is caused to emit a broad ion beam toward the sample. First portions of the sample upon which the broad ion beam is incident are milled away, while second portion of the sample that the protective mask of the BIB source blocks is not milled away. Alternatively, or in addition, the sample may be processed in the BIB system using other sample preparation workflows, including but not limited to, the processes described herein.

At step 512, the sample holder is removed from the sample stage area. That is, the sample holder is translated, tilted, and/or rotated by the sample holder transporting element so that the sample holder is either stored in a storage location, a sample transport device, or transported through a port out of the BIB system.

At step 514, it is determined whether another sample is to be processed. If the answer at 514 is yes, then the process returns to step 502 and the sample that is to be processed is determined. If the answer at 514 is no, then the process 500 may end.

Figure 6:
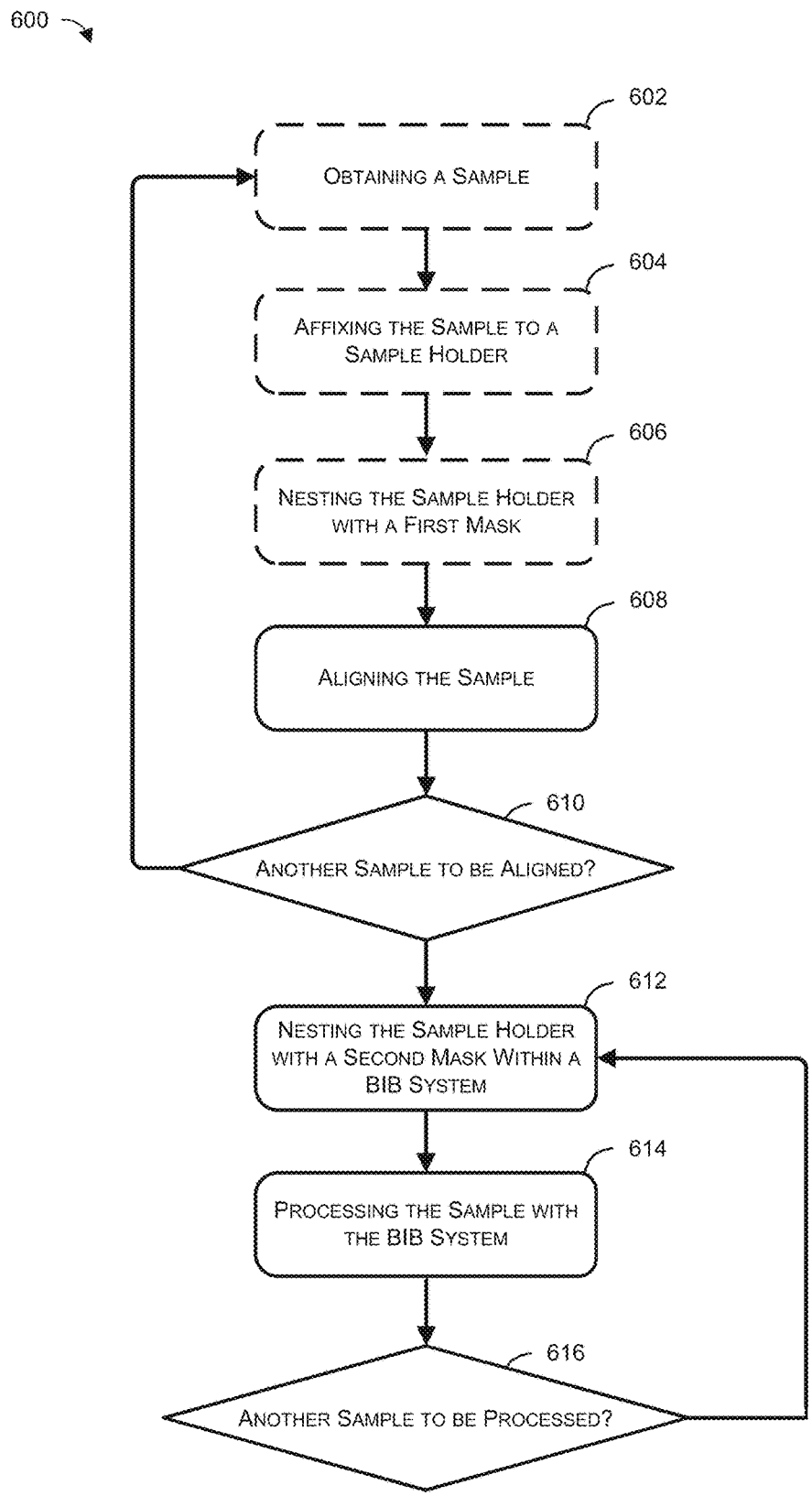
FIG. 6 depicts an example process for processing samples with a BIB system enabling increased system uptime, according to the present invention.

FIG. 6 depicts a sample process 300 for processing samples with a BIB system enabling increased system uptime, according to the present invention. The process 600 may be implemented with any of the BIB systems 102, in any environment, including any of the example environment(s) 200 for more efficient processing of multiple samples within a sample preparation workflow.

At step 602, a sample is obtained. Specifically, the sample may be obtained by harvesting the sample from a larger specimen, growing or depositing portions of the sample, milling away portions of a larger sample, or a combination thereof.

At step 604, the sample is affixed to a sample holder, and at step 606, nesting the sample holder with a first mask. The first mask is geometrically similar to a second protective mask within a BIB system such that a sample that is in a desired alignment with relation to the first mask will also be in the desired alignment with the second sample. That is, when the sample is aligned to a desired position on the sample holder with the first mask, it does not need to be further aligned when the sample holder is subsequently nested in the second mask in the BIB system.

At step 608, aligning the sample with the first mask. For example, a user may use an optical microscope, sensors, or eyesight to manipulate sample alignment elements on the sample holder so that the sample is translated, tilted, or rotated until it is in a desired alignment position. Once the sample is aligned, the sample holder can be translated to a sample storage area within the BIB system and/or from within a sample storage/transport device (e.g., a storage cassette). For example, after a sample is pre-aligned in this way, the sample holder may be transported to a storage location in the BIB system in which the sample is to be processed. In some embodiments, the BIB system may have a separate sample alignment chamber in which some or all of steps 602-608 may be performed, and a sample manipulation element may transport the sample holder containing the aligned sample into a storage location within the BIB system. In this way, as a user is aligning samples with the first mask, the BIB system can be processing pre-aligned samples using the second mask.

In an alternative example, once the sample is aligned with the first mask, the sample may be loaded onto a sample transport device that protect the sample during transportation/loading into the BIB system in which they will be processed. Such a transport device may be configured to transport a single sample holder or many sample holders. In some embodiments, the transport devices may preserve a pressure or gaseous environment around the sample during transport. In this way, a sample can be prepared in a sample preparation area having a controlled pressure and/or gaseous composition, and then transported to the BIB system without exposing the sample to a new pressure/gaseous composition.

At step 610, it is determined whether another sample is to be aligned. If the answer at 610 is yes, then the process returns to step 602 and another sample is obtained. In this way, multiple samples can be pre-aligned and loaded into a sample storage area within the BIB system and/or from within a sample storage/transport device. Because a user can align many samples in a continuous manner, the throughput of the sample preparation across a plurality of samples using this method can be greatly streamlined.

If the answer at 610 is no, then the process 600 continues at step 612 where the sample holder is nested with a second mask within a BIB system. Because the sample was pre-aligned with the first mask, when the sample holder is nested with the second mask it does not need further alignment. This greatly increases the speed at which samples can be processed within the system.

At step 614, the sample is processed with the BIB system. For example, portion of the sample can be removed with an optical or broad ion beam according to any of the processes described herein. Additionally, since much of the user input that is presently needed by current BIB systems is related to the alignment process, by pre-aligning the samples using this process, the required user input can be performed all at once during the alignment of multiple samples, and the remaining processing steps can be at least partially automated such that a BIB system according to the present invention is able to process multiple pre-aligned samples with little or no user input/oversight.

At step 616, it is determined whether another sample is to be processed. If the answer at 616 is yes, then the process returns to step 612 and another sample holder is nested with the second mask. If the answer at 616 is no, then the process 600 may end.

Figure 7A:
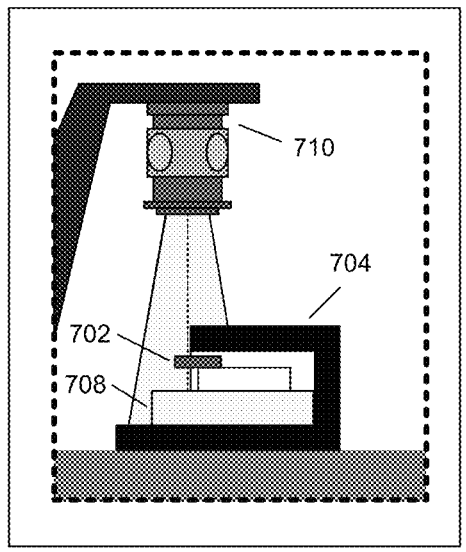
FIGS. 7A and 7B are example drawings that illustrate a sample being pre-aligned with a first mask, and the sample subsequently being processed with a BIB system containing a second mask Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.
Figure 7B:
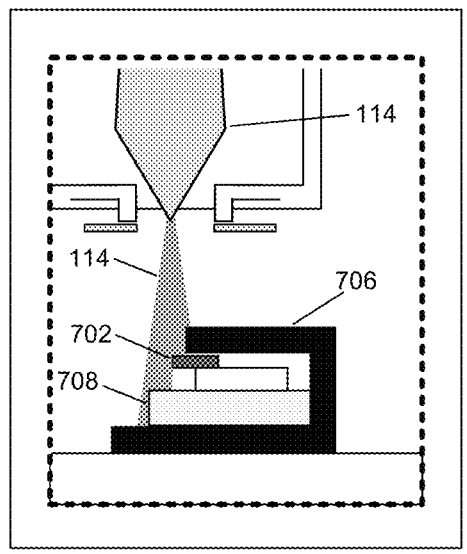

FIGS. 7A and 7B are example drawings that illustrate a sample 702 being pre-aligned with a first mask 704, and the sample 702 subsequently being processed with a BIB system containing a second mask 706. Specifically, FIG. 7A shows the sample 702 being aligned on a sample holder 708 using an optical microscope 710. FIG. 7B shows the sample 704 being processed within a BIB system using a broad ion beam 712 from a BIB source 714. Because the sample 702 was pre-aligned with the first mask 704, and because the second mask 706 is geometrically similar to the first mask 704, the sample 702 does not need to be aligned/positioned within the BIB system.

Examples of inventive subject matter according to the present disclosure are described in the following enumerated paragraphs.

A1. A broad ion beam (BIB) sample preparation system having improved uptime, the BIB sample preparation system comprising: a housing defining an interior volume; a sample stage positioned within the interior volume, wherein the sample stage is configured to hold a sample holder during polishing of a sample held by the sample holder; a first BIB source configured to emit a first broad ion beam towards the sample when in use, wherein the first BIB source is positioned within a first source housing; and a second BIB source configured to emit a second broad ion beam towards the sample when in use, wherein the first BIB source is positioned within a first source housing, wherein the second BIB source is configured to be removed while the first BIB source is emitting the first broad ion beam toward the sample.

A2. The BIB sample preparation system of paragraph A1, wherein the second source is further configured to be reinstalled while the first BIB source is emitting the first broad ion beam toward the sample.

A2.1. The BIB sample preparation system of paragraph A2, wherein the first source is configured to be removed while the second source is emitting the second broad ion beam toward the sample.

A2.2. The BIB sample preparation system of any of paragraphs A2-A2.2, wherein the first source is configured to be reinstalled while the second BIB source is emitting the second broad ion beam toward the sample.

A3. The BIB sample preparation system of any of paragraphs A1-A2.2, wherein the first source housing and the second source housing are each at least partially located within the interior volume.

A4. The BIB sample preparation system of any of paragraphs A1-A3, wherein the first source housing at least partially defines: a first volume which includes the first BIB source; and a first aperture that connects the first volume with the interior volume.

A4.1. The BIB sample preparation system of paragraph A4, further comprising a first valve configured to switch between: an open state where the ions emitted from the first BIB source are allowed to pass through the first aperture from the first volume to interior volume; and a sealed state where the first valve prevents ions or emissions from the sample from passing from the interior volume to the first volume.

A4.1.1. The BIB sample preparation system of paragraph A4.1, wherein when the first valve is in the sealed state, the first volume may be opened to an external environment without affecting the pressure within the interior volume.

A4.1.2. The BIB sample preparation system of any of paragraphs A4.1-A4.1.1, wherein when the first valve is in the sealed state, the first volume may be opened to an external environment without affecting the composition of gases within the interior volume.

A4.1.3. The BIB sample preparation system of any of paragraphs A4.1-A4.1.2, wherein when the first valve is in the sealed state, the first BIB source can be at least one of removed and reinstalled from the BIB sample preparation system without affecting the pressure or gas composition within the interior volume.

A4.1.4. The BIB sample preparation system of any of paragraphs A4.1-A4.1.3, wherein when the first valve is in the sealed state, the first volume may be opened to an external environment without breaking a vacuum in the interior volume.

A4.1.5. The BIB sample preparation system of any of paragraphs A4.1-A4.1.4, wherein the first valve corresponds to one of a shutter, a valve, or a door.

A4.2. The BIB sample preparation system of any of paragraphs A4-A4.1.5, wherein the first housing further defines a first BIB source maintenance aperture which allows the first BIB source to be removed from or reinstalled within the first volume.

A4.2.1. The BIB sample preparation system of paragraph A4.1, further comprising a first access port that is configured to switch between: an open state in which the first BIB source can be removed from or reinstalled within the first volume; and a closed state the first volume is sealed from the external environment.

A4.2.2. The BIB sample preparation system of paragraph A4.2.1, wherein the first housing is configured to, when the first valve and the first access port are each in the closed state, allow the first volume to be pressurized independently of the interior volume or the second volume.

A5. The BIB sample preparation system of any of paragraphs A1-A4.2.2, wherein the second source housing at least partially defines: a second volume which includes the second BIB source; and a second aperture the connects the second volume with the interior volume.

A5.1. The BIB sample preparation system of paragraph A5, further comprising a second valve configured to switch between: an open state where the ions emitted from the second BIB source are allowed to pass through the second aperture from the second volume to interior volume; and a sealed state where the second valve prevents ions or emissions from the sample from passing from the interior volume to the second volume.

A5.1.1. The BIB sample preparation system of paragraph A5.1, wherein when the first valve is in the sealed state, the first volume may be opened to an external environment without affecting the pressure within the interior volume.

A5.1.2. The BIB sample preparation system of any of paragraphs A5.1-A5.1.1, wherein when the first valve is in the sealed state, the first volume may be opened to an external environment without affecting the composition of gases within the interior volume.

A5.1.3. The BIB sample preparation system of any of paragraphs A5.1-A5.1.21, wherein when the first valve is in the sealed state, the first BIB source can be at least one of removed and reinstalled from the BIB sample preparation system without affecting the pressure or gas composition within the interior volume.

A5.1.4. The BIB sample preparation system of any of paragraphs A5.1-A5.1.3, wherein when the first valve is in the sealed state, the first volume may be opened to an external environment without breaking a vacuum in the interior volume.

A5.1.5. The BIB sample preparation system of any of paragraphs A5.1-A5.1.4, wherein the second valve corresponds to one of a shutter, a valve, or a door.

A5.2. The BIB sample preparation system of any of paragraphs A5-A5.1.5, wherein the second housing further defines a second BIB source maintenance aperture which allows the second BIB source to be removed from or reinstalled within the second volume.

A5.2.1. The BIB sample preparation system of paragraph A5.1, further comprising a second access port that is configured to switch between: an open state in which the second BIB source can be removed from or reinstalled within the second volume; and a closed state the second volume is sealed from the external environment.

A5.2.2. The BIB sample preparation system of paragraph A5.2.1, wherein the second housing is configured to, when the second valve and the second access port are each in the closed state, allow the second volume to be pressurized independently of the interior volume or the first volume.

A6. The BIB sample preparation system of any of paragraphs A1-A5.2.2, further comprising one or more additional BIB sources.

A7. The BIB sample preparation system of any of paragraphs A1-A5.2.2, wherein the first BIB source emits the first broad ion beam toward the sample along a first axis, the second BIB source emits the second broad ion beam toward the sample along a second axis, and the angle between the first source and the second source is between 60 degrees and 120 degrees.

A8. The BIB sample preparation system of any of paragraphs A1-A7, wherein, further comprising: a processor; and a memory storing computer readable instructions that, when executed on the processor, cause the processor to initiate the performance of the method of any of paragraphs B1-B7.2.1.

B1. A method for operating a broad ion beam (BIB) polisher having improved uptime, the method comprising: causing a first BIB source to emit a first broad ion beam towards a sample positioned within an interior volume of the BIB polisher, wherein the first broad ion beam causes a portion of the sample upon which it is incident to be removed; removing, while the first BIB source is in emitting the first broad ion beam towards the sample, a second BIB source from the BIB polisher, wherein the second BIB source is configured to emit a second broad ion beam towards the sample when the second BIB source is in use.

B2. The method of paragraph B1, further comprising reinstalling the second BIB source into the BIB polishing system.

B2.1. The method of paragraph B2, wherein the second BIB source is reinstalled while the first BIB source is emitting the first broad ion beam.

B2.1.1. The method of paragraph B2.1, wherein the second BIB source is reinstalled while the first BIB source is emitting the first broad ion beam towards the sample.

B2.1.2. The method of paragraph B2.1, wherein the second BIB source is reinstalled while the first BIB source is emitting the first broad ion beam towards a different sample.

B3. The method of any of paragraphs B1-B2.1, further comprising causing the second BIB source to emit the second broad ion beam.

B3.1. The method of paragraph B3, wherein the second broad ion beam is emitted towards the sample.

B3.2. The method of paragraph B3, wherein the second broad ion beam is emitted towards a different sample.

B4. The method of any of paragraphs B1-B3.2, further comprising installing a third BIB source into the BIB polishing system.

B4.1. The method of paragraph B4, wherein the third BIB source is installed while the first BIB source is emitting the first broad ion beam.

B4.1.1. The method of paragraph B4.1, wherein the third BIB source is installed while the first BIB source is emitting the first broad ion beam towards the sample.

B4.1.2. The method of paragraph B4.1, wherein the third BIB source is installed while the first BIB source is emitting the first broad ion beam towards a different sample.

B4.2. The method of any of paragraphs B4-B4.1.2, further comprising: causing the third BIB source to emit a third broad ion beam; and removing, while the third BIB source is in emitting the third broad ion beam, the first BIB source from the BIB polisher.

B5. The method of any of paragraphs B1-B4.2, further comprising: causing the second BIB source to emit the second broad ion beam towards a new sample positioned within the interior volume of the BIB polisher, wherein the second broad ion beam causes a portion of the new sample upon which it is incident to be removed; and removing, while the second BIB source is in emitting the second broad ion beam towards the new sample, the first BIB source from the BIB polisher.

B6. The method of any of paragraphs B4.2-B5, further comprising reinstalling the first BIB source into the BIB polishing system.

B6.1. The method of paragraph B6, wherein the first BIB source is reinstalled while the second BIB source is emitting the second broad ion beam.

B6.1.1. The method of paragraph B6.1, wherein the first BIB source is reinstalled while the second BIB source is emitting the second broad ion beam towards the sample.

B6.1.2. The method of paragraph B6.1, wherein the first BIB source is reinstalled while the second BIB source is emitting the second broad ion beam towards a different sample.

B7. The method of any of paragraphs B1-B6.1.2, wherein the BIB polisher comprises a source housing that defines a housing volume and an aperture between the housing volume and the interior volume of the BIB polisher.

B7.1. The method of paragraph B7, wherein the second BIB source is positioned within the housing volume.

B7.2. The method of any of paragraphs B7-B7.1, wherein the BIB polisher further comprises a valve configured to switch between: an open state where the ions emitted from the second BIB source are allowed to pass through the aperture from the housing volume to interior volume; and a sealed state where the valve prevents ions or emissions from the sample from passing from the interior volume to the housing volume.

B7.2.1. The method of paragraph B7.2, further comprising causing the valve to switch to the sealed state before removing the second BIB source from the BIB polisher.

C1. A method for preparing a sample with a combined broad ion beam (BIB) and laser sample preparation system, the method including the steps: positioning a sample within the interior volume of the combined sample preparation system; causing a laser source component of the combined sample preparation system to emit an optical beam towards the sample, wherein the optical beam causes a first portion of the sample upon which it is incident to be removed; and causing a BIB source component of the combined sample preparation system to emit a broad ion beam towards the sample, wherein the broad ion beam causes a second portion of the sample upon which it is incident to be removed to reveal a region of interest.

C2. The method of paragraph C1, wherein the sample is irradiated by each of the optical beam and the broad ion beam without removing the sample from the interior volume.

C2.1. The method of paragraph C2, wherein the sample is irradiated by each of the optical beam and the broad ion beam without repositioning the sample C2.2. The method of any of paragraphs C2-C2.1, wherein the sample is irradiated by each of the optical beam and the broad ion beam without repositioning the laser source C2.3. The method of any of paragraphs C2-C2.2, wherein the sample is irradiated by each of the optical beam and the broad ion beam without repositioning the BIB source.

C3. The method of any of paragraphs C1-C2.3, wherein the laser source if configured to irradiate the sample with the optical beam for a first time period, and the BIB source is configured to irradiate the sample with the optical beam for a first time period.

C3.1. The method of paragraph C2, wherein at least one of the first time period and the second time period is a predetermined time period.

C3.2. The method of any of paragraphs C3-C3.1, wherein at least one of the first time period and the second time period is provided via a user input.

C3.3. The method of any of paragraphs C3-C3.2, wherein at least one of the first time period and the second time period is determined by accessing sample information associated with the sample C3.4. The method of any of paragraphs C3-C3.3, wherein at least one of the first time period and the second time period is determined based on a material of the first portion of the sample C3.5. The method of any of paragraphs C3-C3.4, wherein at least one of the first time period and the second time period is determined based on one or more sensors receiving information indicating that the first portion of the sample has been removed C3.6. The method of any of paragraphs C3-C3.5, wherein at least one of the first time period and the second time period is determined based on one or more sensors receiving information indicating that the second portion of the sample has been removed.

C3.7. The method of any of paragraphs C3-C3.6, wherein at least one of the first time period and the second time period is determined based on one or more sensors receiving information indicating that the region of interest has been exposed.

C3.8. The method of any of paragraphs C3-C3.7, wherein at least one of the first time period and the second time period is determined based on one or more of a laser strength, a portion of the sample to be removed with the laser, a BIB strength, a portion of the sample to be removed with BIB, a surface of interest, or a combination thereof.

C4. The method of any of paragraphs C1-C3.8, wherein the method further comprises receiving sample information.

C4.1. The method of paragraph C4, wherein the sample information is received via user input.

C4.2. The method of paragraph C4, wherein the sample information is received by accessing a data file associated with the sample.

C4.3. The method of any of paragraphs C4-C4.2, wherein the sample information includes one or more of a sample composition, a region of interest, and a surface of interest.

C4.4. The method of any of paragraphs C4-C4.3, wherein the sample information includes one or more processing schedules.

C4.4.1. The method of paragraph C4.4, wherein the method further comprises determining one or more processing schedules based on the sample information.

C4.4.2. The method of paragraph C4.4, wherein the one or more processing schedules comprise one or more of a laser strength, a laser milling time, a portion of the sample to be removed with the laser, a BIB strength, a BIB milling time, a portion of the sample to be removed with BIB, a surface of interest, or a combination thereof.

C5. The method of any of paragraphs C1-C4.4.2, further comprising: positioning an additional sample within the interior volume of the combined sample preparation system; causing the laser source component of the combined sample preparation system to emit an additional optical beam towards the additional sample, wherein the additional optical beam causes a first portion of the additional sample upon which it is incident to be removed; and causing the BIB source component of the combined sample preparation system to emit an additional broad ion beam towards the additional sample, wherein the additional broad ion beam causes a second portion of the additional sample upon which it is incident to be removed to reveal an additional region of interest.

C6. The method of any of paragraphs C1-C5, wherein the optical beam removes sample material 20×, 30×, 50×, or more rapidly than the broad ion beam.

D1. A combined broad ion beam (BIB) and laser sample preparation system having improved polishing throughput, the combined sample preparation system comprising: a housing defining an interior volume; a sample stage positioned within the interior volume, wherein the sample stage is configured to hold a sample holder during polishing of a sample held by the sample holder; a laser source configured to emit an optical beam towards the sample when in use, wherein the optical beam causes a first portion of the sample upon which it is incident to be removed; and a BIB source configured to emit a broad ion beam towards the sample when in use, wherein the broad ion beam causes a second portion of the sample upon which it is incident to be removed to reveal a region of interest.

D2. The combined sample preparation system of paragraph D1, further comprising: a processor; and a memory storing computer readable instructions that, when executed on the processor, cause the processor to initiate the performance of the method of any of paragraphs C1-C6.

E1. A storage cassette for storing multiple samples for broad ion beam (BIB) polishing, the storage cassette comprising: a housing at least partially defining an internal storage volume; a plurality of sample holder housings located within the internal storage volume, wherein each individual sample holder housing is configured to receive a sample holder that includes a corresponding sample for polishing in a BIB system; and wherein the storage cassette is configured to be inserted into the BIB system, and each of the sample holder housings are further configured to allow its corresponding sample holder to be removed from the cassette when the cassette is inserted into the BIB system so that the corresponding sample can be polished by the BIB system.

F1. A broad ion beam (BIB) system for efficient processing of multiple samples, the BIB system comprising: a housing defining an interior volume; a sample stage positioned within the interior volume, wherein the sample stage is configured to hold a sample holder during polishing of a sample held by the sample holder; a BIB source configured to emit a broad ion beam towards the sample when in use, wherein the first BIB source is positioned within a first source housing; a cassette housing configured to receive and hold a storage cassette of any of paragraphs E1-EXX; and a sample holder manipulator configured to: remove individual sample holders from the storage cassette; load the individual sample holders onto the sample stage so that the corresponding sample can be processed; remove the individual sample holder from the sample stage after the corresponding sample has been processed; and load the individual sample holder back into the storage cassette.

F2. The BIB system of paragraph F1, further comprising: a processor; and a memory storing computer readable instructions that, when executed on the processor, cause the processor to initiate the performance of the method of any of paragraphs G1-G6.4.2.

G1. A method for efficiently processing multiple samples with a broad ion beam (BIB) system, the method comprising the steps of: removing an individual sample holder containing a sample from a storage cassette; loading the individual sample holders onto a sample stage configured to hold the sample holder during polishing of the corresponding sample held by the individual sample holder; causing a BIB source to emit a broad ion beam towards the sample, wherein the broad ion beam removes at least a portion of the sample upon which it is incident; removing the individual sample holder from the sample stage after the corresponding sample has been processed; and loading the individual sample holder back into the storage cassette.

G1.1. The method of paragraph G1, further comprising receiving a storage cassette of paragraph E1 for processing in a BIB system.

G2. The method of any of paragraphs G1-G1.1, wherein the storage cassette stores a plurality of sample holders that each contain a corresponding sample G2.1. The method of paragraph G2, further comprising: removing another individual sample holder containing another sample from the storage cassette; loading the another individual sample holders onto the sample stage; causing the BIB source to emit another broad ion beam towards the sample, wherein the another broad ion beam removes at least a portion of the another sample upon which it is incident; removing the another individual sample holder from the sample stage after the corresponding another sample has been processed; and loading the another individual sample holder back into the storage cassette.

G2.2. The method of any of paragraphs G2-G2.1, further comprising repeating the method steps recited in paragraph G2.1 for one or more additional samples holders stored in the storage cassette.

G3. The method of any of paragraphs G2-G2.2, wherein the samples in the sample holders stored in the storage cassette are pre-aligned.

G3.1. The method of paragraph G2, wherein the samples are pre-aligned in their respective sample holders using the method of any of paragraphs H1-H9.

G4. The method of any of paragraphs G1-G3.1, wherein the steps described in any of paragraphs G1-G3.1 are at least partially automatically performed by the BIB system.

G4.1. The method of paragraph G3.1, wherein the steps described in any of paragraphs G1-G3.1 is performed without user input.

G5. The method of any of paragraphs G1-C4.1, wherein the BIB source is configured to irradiate the sample with the broad ion beam for a time period.

G5.1. The method of paragraph G5, wherein the time period is a predetermined time period.

G5.2. The method of any of paragraphs G5-G5.1, wherein the time period is provided via a user input.

G5.3. The method of any of paragraphs G5-G5.2, wherein the time period is determined by accessing sample information associated with the sample G5.4. The method of any of paragraphs G5-G5.3, wherein the time period is determined based on a material of the portion of the sample G5.5. The method of any of paragraphs G5-C3.4, wherein the time period is determined based on one or more sensors receiving information indicating that the portion of the sample has been removed G5.7. The method of any of paragraphs G5-C3.6, wherein the time period is determined based on one or more sensors receiving information indicating that a region of interest has been exposed.

G5.8. The method of any of paragraphs G5-C3.7, wherein the time period is determined based on one or more of a BIB strength, a portion of the sample to be removed with BIB, a surface of interest, or a combination thereof.

G6. The method of any of paragraphs G1-G5.8, wherein the method further comprises receiving sample information.

G6.1. The method of paragraph G6, wherein the sample information is received via user input.

G6.2. The method of paragraph G6, wherein the sample information is received by accessing a data file associated with the corresponding sample.

G6.2.1. The method of paragraph G6.2, wherein the data file is stored on a memory component of the storage cassette.

G6.3. The method of any of paragraphs G6-G6.2, wherein the sample information includes one or more of a sample composition, a region of interest, and a surface of interest.

G6.4. The method of any of paragraphs G6-G6.3, wherein the sample information includes one or more processing schedules.

G6.4.1. The method of paragraph G6.4, wherein the method further comprises determining one or more processing schedules based on the sample information.

G6.4.2. The method of paragraph G6.4, wherein the one or more processing schedules comprise one or more of a BIB strength, a BIB milling time, a portion of the sample to be removed with BIB, a surface of interest, or a combination thereof.

H1. A method for pre-aligning samples for more efficient processing of multiple samples with a broad ion beam (BIB) system, the method comprising the steps of: affixing a sample to an adjustable portion of a sample holder; nesting the sample holder with a first mask having a first mask edge, wherein the first mask is positioned outside of a broad ion beam (BIB) system; aligning the sample such that it has a desired geometric relationship to the first mask edge; and nesting the sample holder with a second mask having a second mask edge, wherein the second mask is positioned within a BIB system, and wherein the first mask and the second mask are geometrically similar such that the geometric relationship between the first mask edge and the sample when the sample holder is nested with the first mask is the same as the geometric relationship between the second mask edge and the sample when the sample holder is nested with the second mask.

H2. The method of paragraph H1, wherein when the sample holder is nested with the second mask, the sample has the desired geometric relationship with the second edge without any alignment of the sample within the BIB system.

H3. The method of any of paragraphs H1-H2, further comprising irradiating a portion of the second mask and a portion of the sample with a broad ion beam to remove portions of the sample.

H3.1. The method of paragraph H3.1, wherein the second mask is made of a hard material that is not degraded by the broad ion beam.

H3.2. The method of any of paragraphs H3-H3.1, wherein the second mask blocks a portion of the broad ion beam such that a portion of interest of the sample is not removed from the sample.

H4. The method of any of paragraphs H1-H3.2, wherein aligning corresponds to adjusting the adjustable portion of the sample holder so that the sample is positioned such that it has a desired geometric relationship to the first mask edge.

H5. The method of any of paragraphs H1-H4, wherein the first mask and the second mask are geometrically identical.

H6. The method of any of paragraphs H1-H5, wherein the sample is affixed to the sample and aligned within a closed environment.

H6.1. The method of paragraph H6, wherein the closed environment has an inert gas atmosphere.

H6.2. The method of any of paragraphs H6-H6.1, wherein the closed environment has a reduced pressure H6.3. The method of any of paragraphs H6-H6.2, wherein the closed environment has a vacuum pressure level.

H7. The method of any of paragraphs H1-H6.3, further comprising transferring the sample holder and the aligned sample from a preparation station to a BIB system.

H7.1. The method of paragraph H7, wherein the BIB system is a BIB system of any of A1-A8, D1-D2, and/or F1-F2.

H7.2. The method of any of paragraphs H7-H7.1, wherein the preparation station is a closed environment of paragraphs H6-H6.3.

H7.3. The method of any of paragraphs H7-H7.2, wherein transferring the sample comprises loading the sample into a transfer device configured to interface with both the sample preparation area and the BIB system.

H7.3.1. The method of paragraph H7.3, wherein the transfer device is a sealed compartment for holding the sample holder such that it is sealed from the environment.

H7.3.1.1. The method of paragraph H7.3.1, the sealed compartment having an inert gas.

7.3.2. The method of any of paragraphs H7.3-H7.3.1.1, wherein the transfer device is a storage cassette of paragraph E1.

H8. The method of any of paragraphs H1-H7.3.2, further comprising repeating the method for multiple samples on corresponding sample holders.

H9. The method of any of paragraphs H1-H8, wherein further comprises processing the sample using the methods of any of paragraphs C1-C6 and/or G1-G6.4.2.

I1. Use of the systems of any of paragraphs A1-A8, D1-D2, E1, and/or F1-F2 to perform the method of any of paragraphs C1-C6, G1-G6.4.2, and/or H1-H9.

J1. Non-transitory computer readable media storing instructions that, when executed on a processor, cause the processor to initiate the performance of the method of any of paragraphs C1-C6, G1-G6.4.2, and/or H1-H9.

What is claimed is:

1. A method for efficiently processing multiple samples with a broad ion beam (BIB) system, the method comprising the steps of:
   removing an individual sample holder containing a sample from a storage location within the BIB system, wherein the BIB system includes multiple sample holders positioned in one or more storage locations;
   loading the individual sample holder onto a sample stage configured to hold the sample holder during polishing of the corresponding sample held by the individual sample holder;
   causing a BIB source to emit a broad ion beam towards the sample, wherein the broad ion beam removes at least a portion of the sample upon which it is incident;
   removing the individual sample holder from the sample stage after the corresponding sample has been processed; and
   loading the individual sample holder back into the storage location.

2. The method of claim 1, wherein the storage location is a storage cassette for storing multiple samples for broad ion beam polishing, the storage cassette comprising:
   a housing at least partially defining an internal storage volume;
   a plurality of sample holder housings located within the internal storage volume, wherein each individual sample holder housing is configured to receive a sample holder that includes a corresponding sample for polishing in a BIB system; and
   wherein the storage cassette is configured to be inserted into the BIB system, and each of the sample holder housings are further configured to allow its corresponding sample holder to be removed from the cassette when the cassette is inserted into the BIB system so that the corresponding sample can be polished by the BIB system.

3. The method of claim 2, wherein the storage cassette stores a plurality of sample holders that each contain a corresponding sample.

4. The method of claim 3, further comprising repeating the method steps recited in claim 1 for one or more additional samples holders stored in the storage cassette.

5. The method of claim 3, wherein the samples in the sample holders stored in the storage cassette are pre-aligned such that they do not need to be further aligned within the BIB system before being processed.

6. The method of claim 1, further comprising the steps of:
   removing another individual sample holder containing another sample from the storage location;
   loading the another individual sample holders onto the sample stage;
   causing the BIB source to emit another broad ion beam towards the sample, wherein the another broad ion beam removes at least a portion of the another sample upon which it is incident;
   removing the another individual sample holder from the sample stage after the corresponding another sample has been processed; and
   loading the another individual sample holder back into the storage location.

7. The method of claim 1, wherein the method steps are at least partially automatically performed by the BIB system.

8. The method of claim 7, wherein the method steps are performed without user input.

9. The method of claim 1, wherein the BIB source is configured to irradiate the sample with the broad ion beam for a time period.

10. The method of claim 9, wherein the time period is provided via a user input.

11. The method of claim 9, wherein the time period is determined based on one or more sensors receiving information indicating that one of:
    the portion of the sample has been removed; and
    a region of interest has been exposed.

12. The method of claim 9, wherein the time period is determined based on one or more of:
    a BIB strength;
    a portion of the sample to be removed with BIB; and
    a surface of interest.

13. The method of claim 9, further comprising:
    accessing sample information associated with the sample; and
    determining the time period based on the sample information associated with the sample.

14. The method of claim 13, wherein the sample information includes a material of which the portion of the sample is at least partially composed of, and the time period is determined based on the material.

15. The method of claim 13, wherein the sample information is received via a user input.

16. The method of claim 13, wherein the sample information is received by accessing a data file associated with the corresponding sample.

17. The method of claim 16, wherein the data file is stored on a memory component of a storage cassette holding the sample holder.

18. The method of claim 16, further comprising:
    detecting an identifier on the sample holder, the identifier comprising an identification code, a scannable identifier image, and an RFID; and
    wherein the data file is accessed on an accessible memory based on the identifier.

19. The method of claim 13, wherein the sample information includes a processing schedule for the sample, the processing schedule comprising one or more of:
    a BIB strength;
    a BIB milling time;
    a portion of the sample to be removed with BIB; and
    a surface of interest.

20. A storage cassette for storing multiple samples for broad ion beam (BIB) polishing, the storage cassette comprising:
    a housing at least partially defining an internal storage volume;

a plurality of sample holder housings located within the internal storage volume, wherein each individual sample holder housing is configured to receive a sample holder that includes a corresponding sample for polishing in a BIB system; and wherein the storage cassette is configured to be inserted into the BIB system, and each of the sample holder housings are further configured to allow its corresponding sample holder to be removed from the cassette when the cassette is inserted into the BIB system so that the corresponding sample can be polished by the BIB system.

* * * * *